United States Patent
Yong et al.

(10) Patent No.: US 9,257,958 B2
(45) Date of Patent: Feb. 9, 2016

(54) METHODS FOR NOISE REDUCTION AND QUALITY FACTOR IMPROVEMENT IN RESONATORS

(71) Applicant: Rutgers, The State University of New Jersey, New Brunswick, NJ (US)

(72) Inventors: Yook-Kong Yong, Princeton, NJ (US); John R. Vig, Colts Neck, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 0 days.

(21) Appl. No.: 14/283,557

(22) Filed: May 21, 2014

(65) Prior Publication Data
US 2014/0347138 A1    Nov. 27, 2014

Related U.S. Application Data

(60) Provisional application No. 61/825,786, filed on May 21, 2013.

(51) Int. Cl.
*H03H 9/02* (2006.01)

(52) U.S. Cl.
CPC ....... *H03H 9/02818* (2013.01); *H03H 9/02086* (2013.01)

(58) Field of Classification Search
CPC .................................................. H03H 9/02818
USPC ..................................................... 331/70, 158
See application file for complete search history.

(56) References Cited

U.S. PATENT DOCUMENTS

2014/0077890 A1 *  3/2014  Babaie et al. ............. 331/117 R

* cited by examiner

*Primary Examiner* — Joseph Chang
(74) *Attorney, Agent, or Firm* — Fox Rothschild LLP

(57) ABSTRACT

A low phase noise dual mode resonator and a method of making and using said resonator is disclosed. The dual mode resonator is capable of sustaining two frequency vibration modes simultaneously. The two frequency vibration modes are capable of exhibit non-linear coupling when one is driven at a higher voltage than the other. The dual mode resonator is configured such that the ratio of the two vibration frequency modes is a value that maximizes the non-linear coupling effect. As a result of the non-linear effect, the phase noise on the mode that is not overdriven is reduced.

12 Claims, 10 Drawing Sheets ued States Patent US 9,257,958 B2

METHODS FOR NOISE REDUCTION AND QUALITY FACTOR IMPROVEMENT IN RESONATORS

CROSS REFERENCE TO RELATED APPLICATIONS

This application relates to and claims the priority of U.S. Provisional Patent Application Ser. No. 61/825,786, filed May 21, 2013, titled "METHODS FOR NOISE REDUCTION AND QUALITY FACTOR IMPROVEMENT IN RESONATORS", the entire contents and substance of which are hereby incorporated in total by reference.

STATEMENT REGARDING FEDERALLY SPONSORED RESEARCH OR DEVELOPMENT

This invention was made with government support under grant no. HR0011-10-C-0109 awarded by Defense Advance Research Projects Agency (DARPA). The government has certain rights in the invention.

BACKGROUND

1. Statement of the Technical Field

The present disclosure relates to systems and methods for reducing noise and improving the quality factor of resonators used in precision oscillators. More specifically, the present disclosure relates to systems and methods that use an eigenmode of resonator vibrations as a frequency source along with another eigenmode of the same family that is excited nonlinearly.

2. Description of the Related Art

Typically, oscillators exhibit a variety of instabilities. These include aging, noise, and frequency changes with temperature, acceleration, ionizing radiation, power supply voltage, shock, and vibration. The suitability of oscillators for a specific application is limited by deterministic phenomena, such as environmental effects. In other instances, stochastic (random) processes establish the performance limitations. Except for vibration, the short-term instabilities almost always result horn noise associated with the operation of the oscillator.

Noise can have numerous adverse effects on system performance, including: (1) limiting the ability to determine the current state and the predictability of precision oscillators, (2) limiting synchronization and syntonization accuracies; (3) limiting a receiver's useful dynamic range, channel spacing, and selectivity; (4) causing bit errors in digital communications systems; (5) causing loss of lock and limiting acquisition and reacquisition capability in phase-locked-loop systems; and (6) limiting radar performance, especially Doppler radar. It should be noted that this list of adverse effects is shown by way of example only, and additional adverse effects may be attributed to noise.

In a properly designed oscillator, the resonator is the primary noise source close to the carrier frequency, and the oscillator circuitry is the primary source far from the carrier frequency. Current resonators use an eigenmode of vibrations as their frequency source. Proprietary designs of the resonator geometry, electrode geometry and mounting supports define the quality factor of the resonators and its noise characteristics.

BRIEF DESCRIPTION OF THE FIGURES

The present disclosure will be better understood, and objects other than those set forth herein will become apparent when consideration is given to the following detailed description thereof. Such description makes reference to the attached drawings where.

DETAILED DESCRIPTION

Figure 1:
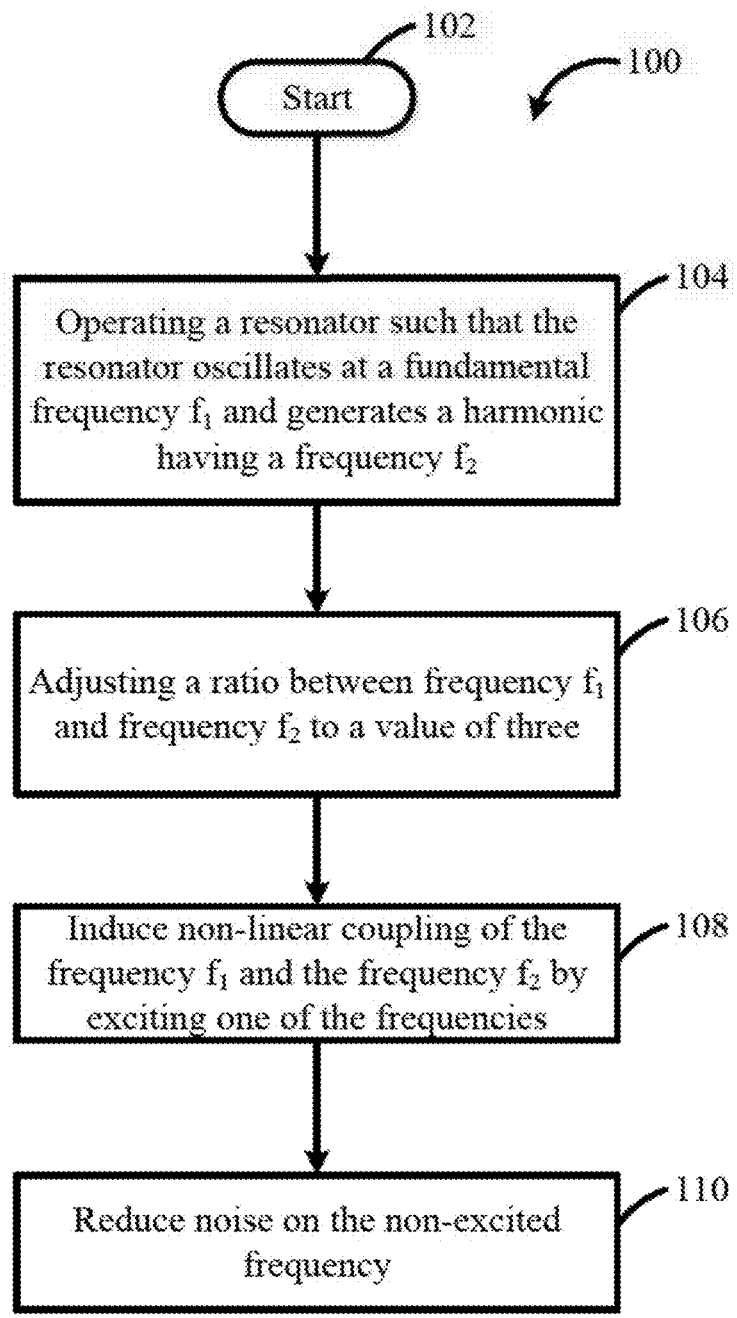
FIG. 1 is a flow diagram of an exemplary method for reducing a resonator's contribution to noise that is useful for understanding the present invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects as illustrative. The scope of the invention is, therefore, indicated by the appended claims. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment" "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Conventional thought in the art has been to avoid nonlinear coupling of a resonator by either not exciting both fundamental and harmonic frequencies or by ensuring that the ratio between the fundamental and harmonic frequencies was not a value which would cause non-linear coupling. The present inventors have discovered that the non-linear coupling may be used to reduce the noise of a signal on one of the resonator frequencies. To accomplish this, the resonator is constructed to ensure that the ratio of the frequencies is equal to a value which will maximize nonlinear coupling (for example, a ratio of three (3) for a fundamental frequency and its third overtone). One of the frequencies is used as the operating frequency while the other frequency (e.g. the fundamental frequency or the third overtone frequency) is overdriven to induce non-linear coupling. Once non-linear coupling is induced, known as "Duffing," the quality factor ("Q factor") of the resonator on the operating frequency is increased and the noise on the operating frequency is reduced.

The present disclosure generally concerns a dual-mode low-phase-noise oscillator including a resonator with a relatively high resonator quality factor ("Q"). The resonator can include, but is not limited to, any resonator that has a symmetric boundary condition, is excited either symmetrically or anti-symmetrically, and has nonlinear constants. Such resonators include quartz crystal resonators employing thickness shear vibrations, flexural vibrations, or extensional vibrations. Additionally, such resonators can include a Surface Acoustic Wave ("SAW") resonator, a Solid Mounted Resonator ("SMR"), and/or a Film Bulk Acoustic Resonator ("FBAR").

The high resonator Q of the dual-mode low-phase-noise oscillator is achieved by implementing a nonlinear eigenmodal vibration method. Notably, in conventional oscillator designs, linear harmonic modes of vibration are used as their frequency source, rather than a nonlinear eigenmodal mode of vibration. As such, the oscillator design of the present disclosure is materially and significantly different than conventional oscillator designs.

The nonlinear eigenmodal vibration method of the present invention will be described in detail below. Still, it should be noted that this method generally involves using two adjacent harmonic modes of vibrations in the resonator. The frequency source comes from either the fundamental mode or its higher overtone mode. When a harmonic mode in the series is excited nonlinearly, it couples with its adjacent harmonic mode that serves as a frequency source. Noise reduction and quality factor improvement of the frequency source comes from the nonlinearly excited adjacent harmonic mode via its two characteristics: (1) The nonlinear Duffing phenomenon reduces the bandwidth of frequency source harmonic mode, and (2) the nonlinear Duffing phenomenon increases the slope of the phase frequency curve of frequency source harmonic mode. These two characteristics of a nonlinear harmonic mode when coupled to the next harmonic mode that serves as a frequency source improves the quality factor and reduce the noise of the frequency source. This Q factor improvement and noise reduction occurs in the fundamental frequency when the third overtone is overdriven due to the non-linear coupling effect. Conversely, when the fundamental frequency is overdriven, Q factor improvement and noise reduction occurs in the third overtone frequency, again due to the non-linear coupling effect.

The dual-mode low-phase-noise oscillator described in this document can be used in a variety of applications. For example, the dual-mode low-phase-noise oscillator may be used in Global Positioning System ("GPS") applications, telecommunication applications, radar system application, and other frequency control applications.

Description of Exemplary Method Embodiments

As noted above, a nonlinear coupling of a series of eigenmodes in crystal resonators has been discovered that advantageously enables previously unrecognized benefits. It is a physical phenomenon of a Fourier series of harmonic modes of vibrations that are coupled nonlinearly by a set of Duffing equations. This nonlinear coupling of eigenmodal vibrations may advantageously be employed for reducing noise in high precision oscillators by improving the resonator Q.

Accordingly, the following discussion is directed to systems and methods for improving a resonator Q via implementation of a nonlinear eigenmodal vibration method. Notably, such systems and methods are described below in relation to thickness shear resonators. One of ordinary skill in the art will notice that the present disclosure is not limited in this regard. The systems and methods can be employed in conjunction with other types of resonators, such as SAW resonators, SMRs and FBARs.

Due to the resonator Q improvement, noise levels are reduced in third overtone resonators by the nonlinear characteristics of their fundamental mode. As the flicker Phase-Modulation ("PM") noise in the sustaining circuit of an oscillator causes flicker Frequency-Modulation ("FM") noise to the oscillator output frequency, the proposed improvement in resonator Q will help in reducing the phase noise. For trapped energy resonators, such as the AT-cut quartz resonators, the fundamental and third overtone modes are well behaved. At high drive levels, the fundamental mode may be described by a Duffing equation which has a nonlinear cubic term in displacement (or charge). This cubic term in displacement at the fundamental frequency has a third overtone frequency component that may be used to improve the Q of third overtone thickness shear resonator.

The coupling of the Duffing equation for the fundamental mode to the third overtone mode may be solved, for example, using a MATLAB® Simulink model. The present disclosure illustrates that the nonlinear cubic term in displacement of the Duffing equation for the fundamental mode may couple to the third overtone mode. Thus, at higher drive levels, the nonlinearities of the fundamental mode may drive the third overtone mode if its resonant frequency is sufficiently close to three times the fundamental frequency. The present disclosure also illustrates that this nonlinear coupling will improve the Q of the third overtone mode.

Referring now to FIG. 1, there is provided an exemplary method for reducing a resonator's contribution to noise. As shown in FIG. 1, method 100 begins with step 102 and continues with step 104. Step 104 involves operating a resonator having specific characteristics and features. For example, the resonator may have two high-Q modes of the same family of eigenmodes, for example, the fundamental operating at frequency $f_1$ and its third overtone operating at frequency $f_2$ may be excited. Since one feature of the present disclosure is for the fundamental mode to nonlinearly couple with the third overtone, it is desirable for the third overtone frequency to be three times the fundamental mode frequency. The closer the ratio of third overtone frequency to fundamental frequency ($f_2/f_1$ ratio) is to three, the greater is the phase noise reduction. In a specific example, the resonator may be a high-Q AT-cut quartz resonator.

In a next step 106, the ratio is adjusted to three in accordance with one of more of the following five techniques (1)-(5).

(1) Use an electrode with two or more thicknesses. When extra mass is added near the center of the resonator plate, the third overtone mode is more sensitive than the fundamental mode to the added mass and will change its frequency more with the added mass. When extra mass is added away from the center, as for example, near the edges of the plate, the fundamental mode is more sensitive than the third overtone to the added mass, and will change its frequency more with the added mass.

(2) Use a tri-mesa plate with various thicknesses that trap individually the harmonic modes and hence control individually their respective frequencies.

(3) Change the curvature of the plate (the two modes' variation with curvature are different, therefore, changing the curvature changes the $f_2/f_1$ ratio).

(4) Change electrode dimensions (the two modes' variation with electrode dimensions are different, therefore, changing the electrode dimensions changes the $f_2/f_1$ ratio).

(5) Vary the temperature of the resonator. The frequency vs. temperature characteristics of the two modes are different, therefore, the $f_2/f_1$ ratio changes continuously as the temperature is varied.

Thereafter, step 108 is performed where non-linear coupling of the frequency $f_1$ and the frequency $f_2$ is induced. For example, a low-phase noise dual mode oscillator is designed and constructed such that (1) it allows two modes of the resonator to be excited simultaneously the fundamental mode and the third overtone mode of an AT-cut resonator) (2) the drive level of the third overtone is set to a value where the phase noise is low in the absence of the fundamental mode being excited; and (3) the drive level of the fundamental mode is set to a value that causes the mode to go into the nonlinear Duffing regime. The characteristics of the nonlinear fundamental mode will decrease the phase noise of the third overtone frequency. As is well known in the art, increasing the Q of a resonator decreases the phase noise close to the carrier as the phase noise has a strong dependence on Q.

Figure 2:
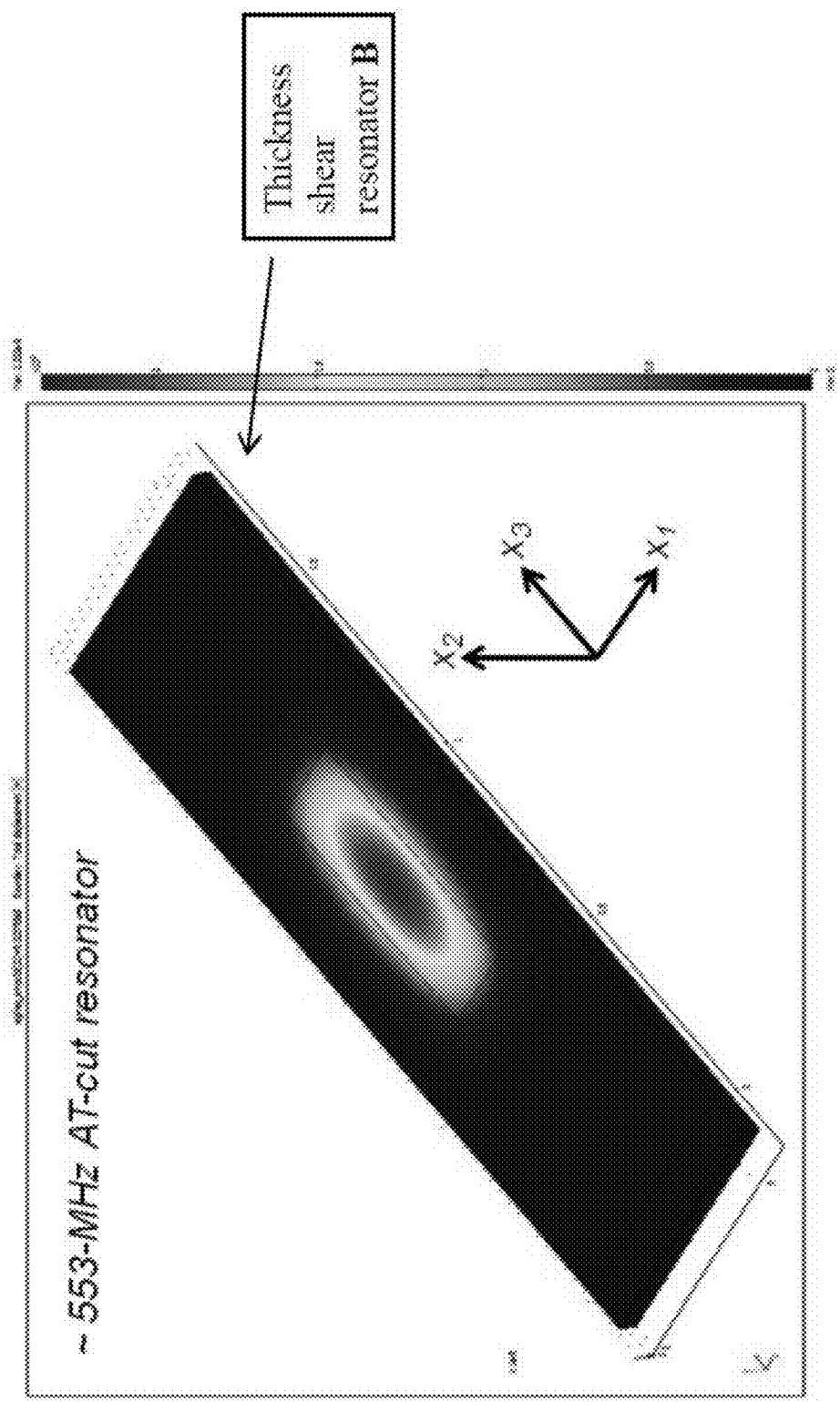
FIG. 2 is a schematic illustration of a finite element model of a thickness shear mode.

Referring now to FIGS. 2-9, an explanation is provided for an exemplary oscillator A designed in accordance with the principles and concepts of the present invention. The exemplary oscillator A comprises a thickness shear resonator B that could be excited to vibrate with two eigenmodes that belong to the same harmonic series of eigenmodes. In this example, the harmonic series of eigenmodes are the fundamental and third overtone thickness Shear modes C shown in FIGS. 2-3. FIG. 2 illustrates a finite element model of the thickness shear mode and its third overtone mode. FIG. 2 also illustrates energy trapping at the center of the resonator. This is an example of a high Q resonator with a very sharp peak at the center of the electrode.

Figure 3:
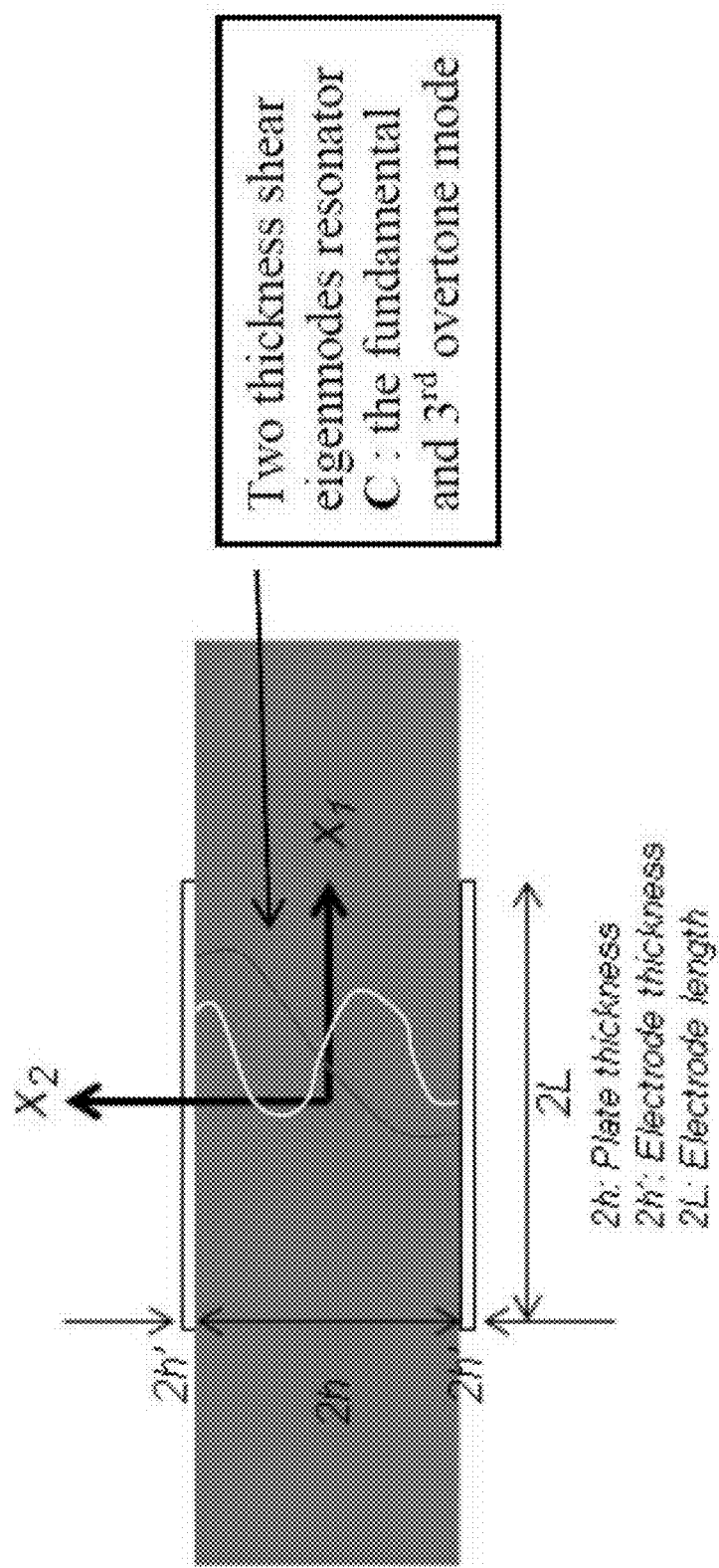
FIG. 3 is a cross-section diagram of a resonator.

FIG. 3 illustrates a schematic cross-sectional diagram of the resonator in the $X_1$-$X_2$ plane showing the fundamental thickness shear mode and it third harmonic overtone mode. Both harmonic modes belong to the same family of eigenmodes, and they may be excited simultaneously in the resonator. A dual mode resonator is a resonator that can be excited at two frequencies simultaneously. Conventional resonators are not driven at multiple frequencies to avoid non-linear coupling effects. These non-linear coupling effects are advantageously utilized in the present disclosure to reduce noise on one of the resonator frequencies.

Figure 4:
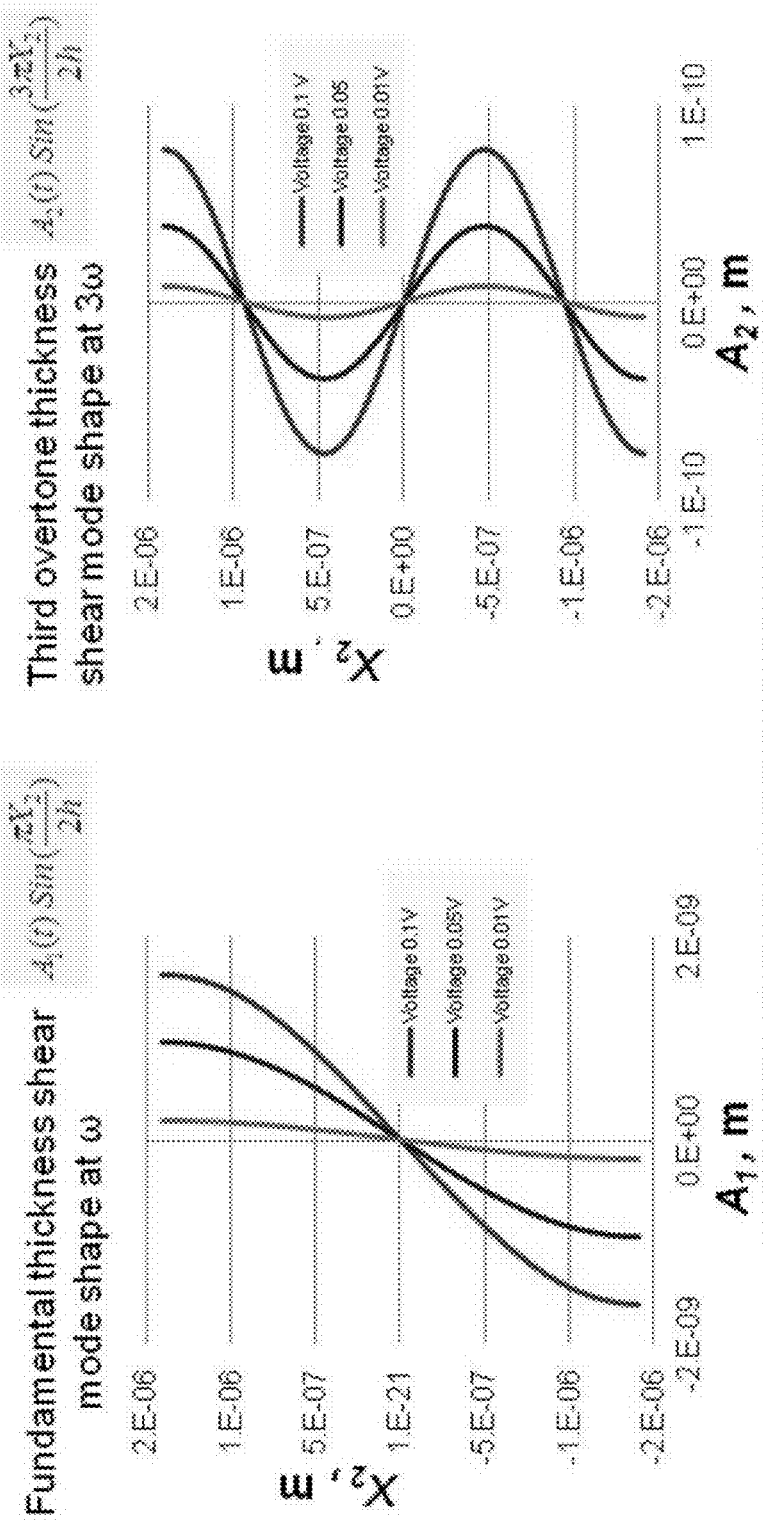
FIG. 4 comprises two graphs illustrating two thickness shear eigenmodes.

The mode shapes in the thickness direction at various voltage drive levels are shown in FIG. 4. FIG. 4 illustrates two thickness shear eigenmodes, the fundamental and its third overtone mode, and their respective voltage drive levels. The two eigenmodes may be uncoupled in current resonators, but the method as described herein may excite the fundamental mode (left) to nonlinear Duffing levels to couple with the third overtone mode (right). It should be noted that the displacement mode shape of fundamental mode is an order of magnitude higher than its third overtone mode for the same voltage drive level. Therefore, the fundamental mode can be excited into the nonlinear Duffing regime while its third overtone mode remains in the linear regime. Here the Duffing regime refers to a nonlinear phenomenon when large displacements of vibrations in a resonator governed by the Duffing equation: $\ddot{u}+C\dot{u}+Ku+\gamma u^3=0$ (where u is the displacement of vibration, C the damping, K the stiffness, and $\gamma$ the nonlinear parameter) cause the effect of the term $\gamma u^3$ to become more pronounced.

Figure 5:
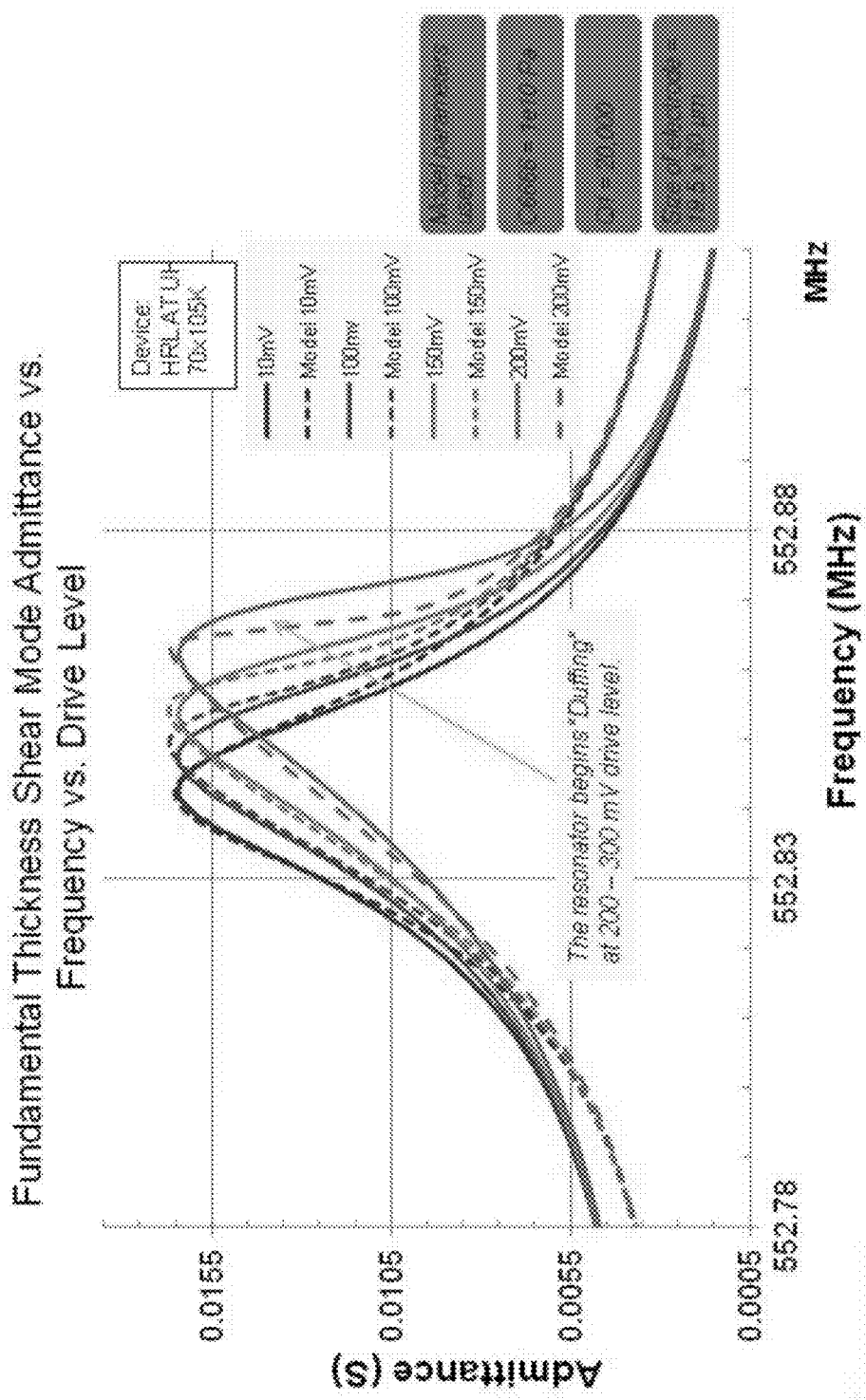
FIG. 5 comprises a graph illustrating frequency admittance curves of a fundamental mode at various voltage drive levels.
Figure 6:
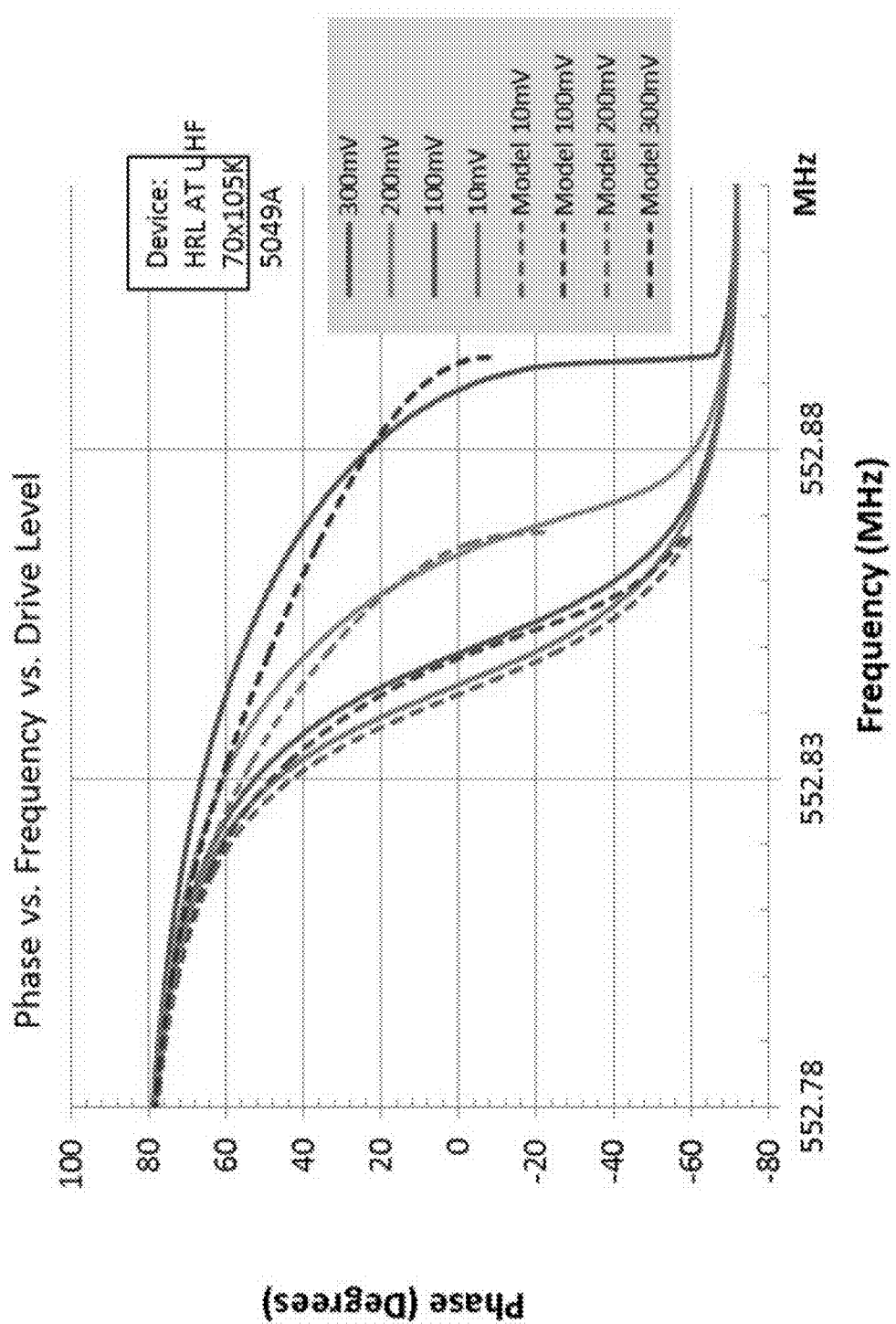
FIG. 6 comprises a graph illustrating phase-frequency curves of the fundamental mode at various voltage drive levels.

FIGS. 5-6 illustrate the nonlinear characteristics of the fundamental mode that may be used for improving the Q of the third overtone mode. Specifically, FIG. 5 illustrates frequency-admittance curves of the fundamental mode at various voltage drive levels that show the reduction of bandwidth at the peak when driven to nonlinear Duffing regime. FIG. 6 illustrates phase-frequency curves of the fundamental mode at various voltage drive levels that show the increase in slope when driven to nonlinear Duffing regime. As shown in FIGS. 5-6, at nonlinear voltage drive levels, the fundamental mode experiences a reduction in bandwidth at its peak while its phase-frequency slope becomes steeper.

Figure 7:
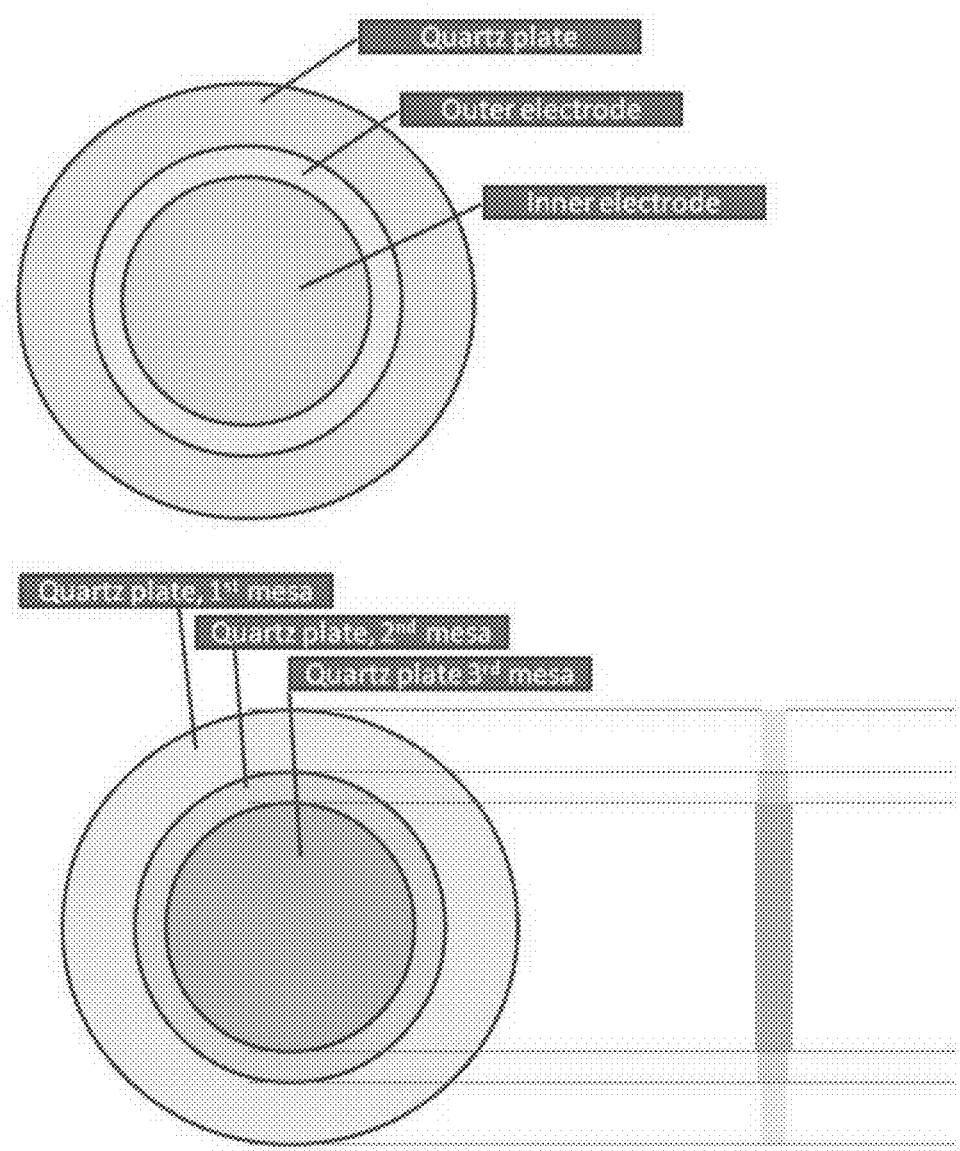
FIG. 7 is a schematic illustration of example schemes for setting a ratio of a third overtone mode frequency to its fundamental mode frequency to three.

The nonlinear characteristics may be coupled into the third overtone mode, thus enabling it to increase its Q when the frequency ratio of the third overtone frequency to fundamental frequency is exactly 3. FIG. 7 illustrates two possible schemes for setting the ratio of the third overtone mode frequency to its fundamental mode frequency to three. More particularly, the top portion of FIG. 7 illustrates a two-thickness electrode that will trap individually the third and fundamental mode. The bottom portion of FIG. 7 illustrates a tri-mesa quartz plate of various thicknesses that will individually trap the third and fundamental mode. In order to bring the frequency ratio of the third overtone frequency to fundamental frequency to three, the two schemes may trap the two modes individually and thus control their respective frequencies. In a particular example, one scheme may use a thin-film electrode of two thicknesses, and the second scheme may use a tri-mesa plate of various thicknesses.

Figure 8A:
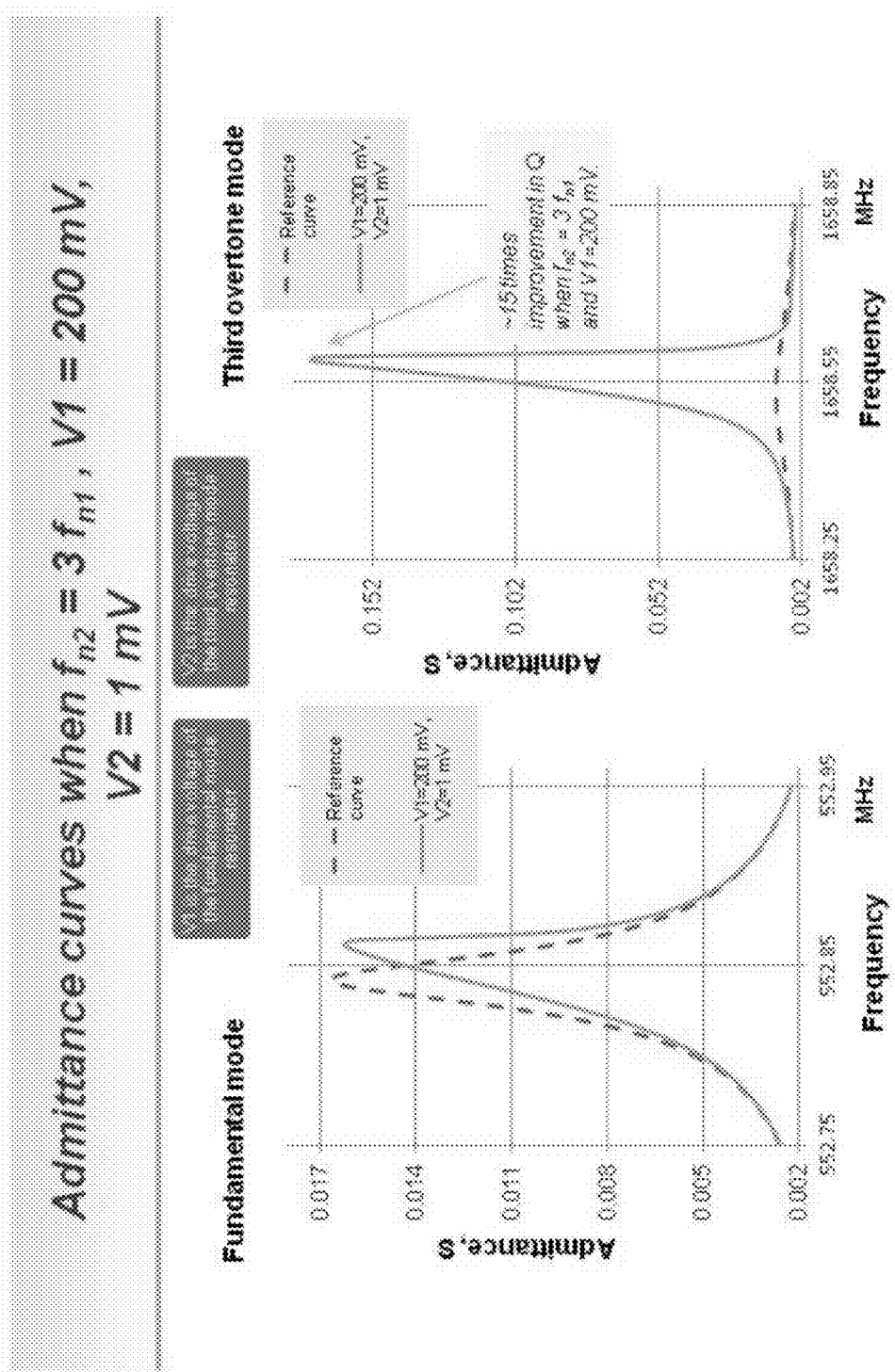
FIG. 8A comprises graphs illustrating a first example of nonlinear eigenmodal coupling of the fundamental mode to its third overtone.

In FIG. 8A, the method shows the increase in Q of the third overtone mode when coupled with a nonlinear fundamental mode. As illustrated in FIG. 8A, a nonlinear eigenmodal coupling of the fundamental mode (left) to its third overtone (right) may increase the quality factor Q of the third overtone mode and, thus, its phase noise reduction of the frequency source. The model shows that it is advantageous to excite the fundamental mode into the nonlinear Duffing regime in order to couple with the third overtone mode.

Figure 8B:
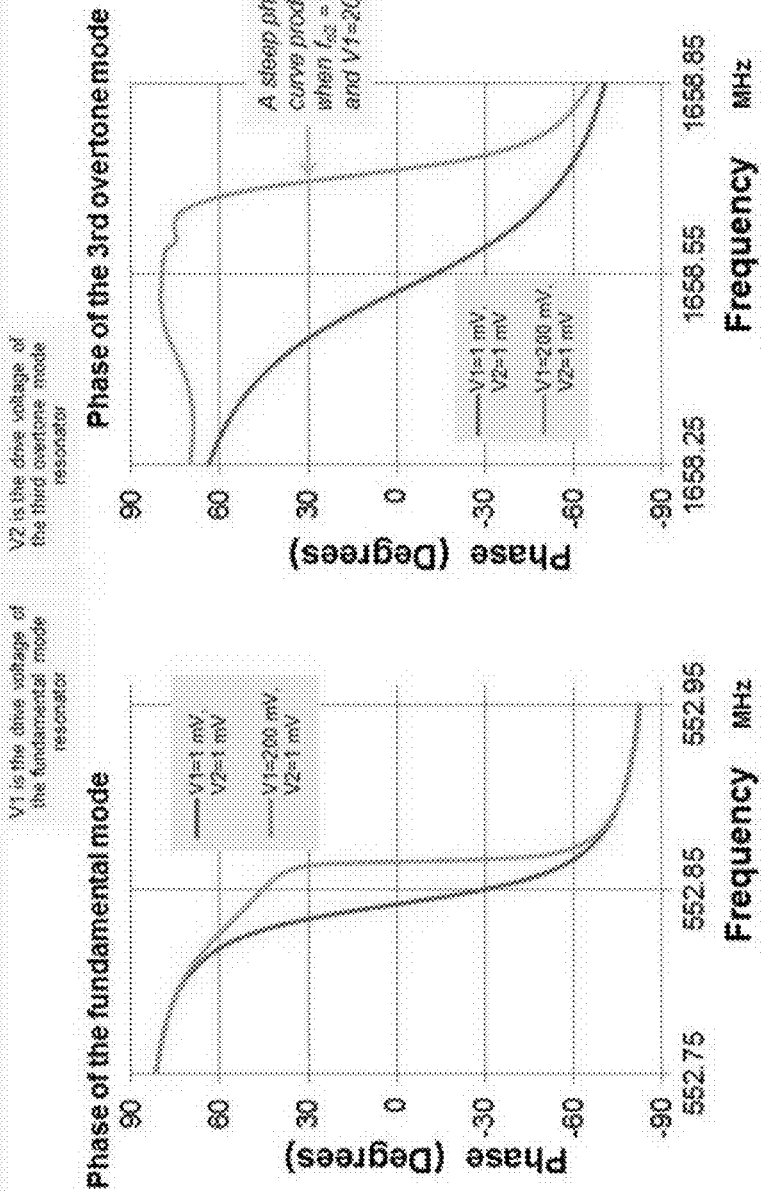
FIG. 8B comprises graphs illustrating a first example of nonlinear phase coupling of the fundamental mode to its third overtone.

FIG. 8B shows the steep slope on the fundamental phase curve (left) being coupled to the third overtone mode to produce as phase curve having a steep slope. Operation of the third overtone resonator in the vicinity of this steep slope of phase curve, along with the improved quality factor Q, will reduce noise.

Figure 9:
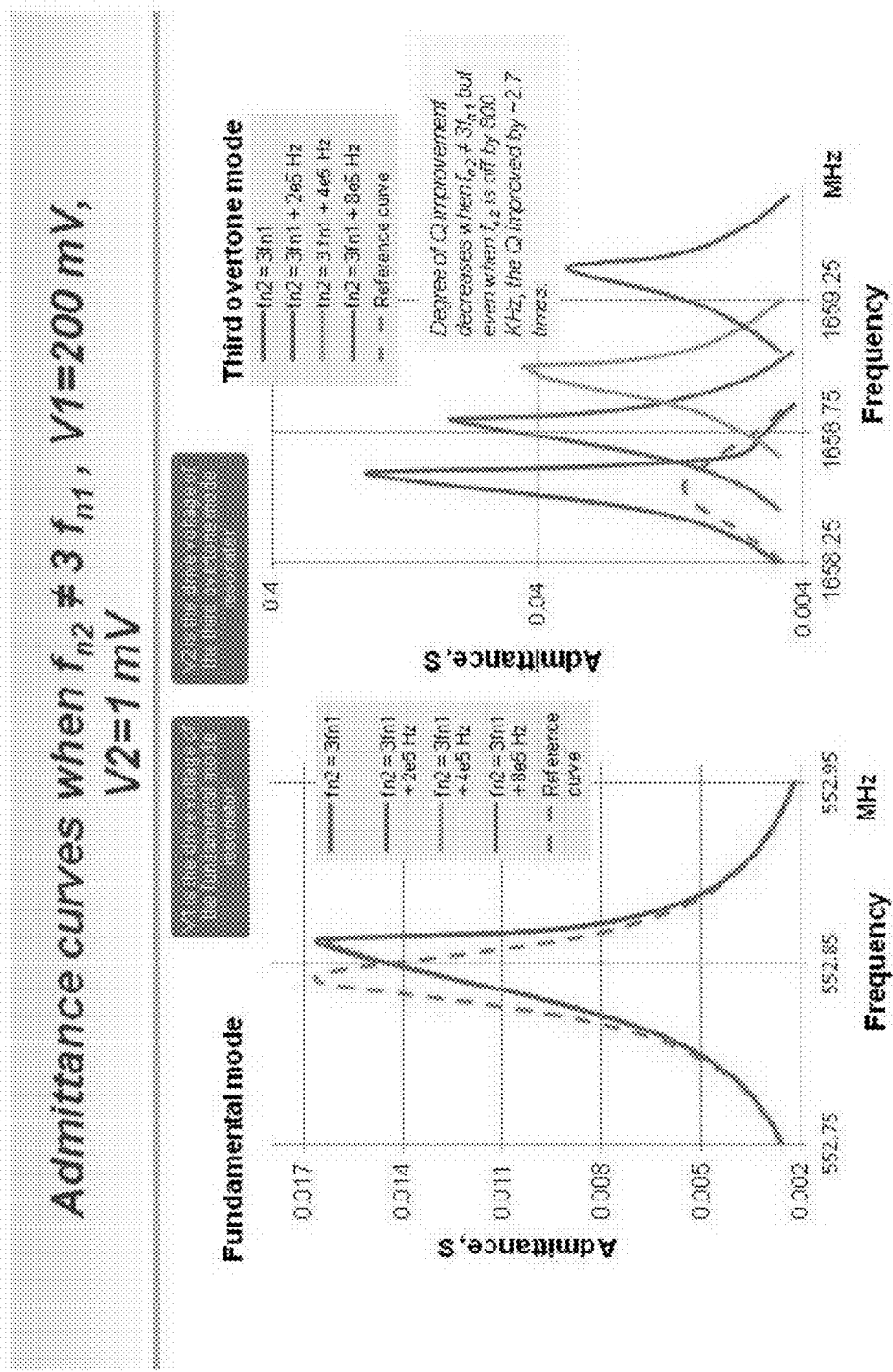
FIG. 9 comprises graphs illustrating a second example of nonlinear eigenmodal coupling of the fundamental mode to its third overtone as the ratio of third overtone frequency to fundamental frequency moves away from three.

In order to include circumstances when the frequency ratio of the third overtone frequency to fundamental frequency is not exactly 3. FIG. 9 illustrates that the methods as described herein may still be applicable, and may improve the Q of the third overtone. The Q improvement is a function of the frequency offset from the frequency ratio ($f_2/f_1$ ratio) of three.

With respect to the above description then, it is to be realized that the optimum improvement of Q and its consequent reduction of phase noise in the frequency source is (a) frequency ratio of the frequency source to its lower harmonic eigenmode is three, and (b) the nonlinear coupling of one eigenmode to another eigenmode the frequency source. The two eigenmodes belong to the same family of eigenmodes. The relationships for the parts of the invention, to include variations in size, materials, shape, form function and manner of operation, assembly and use, are deemed readily apparent and obvious to one skilled in the art, and all equivalent relationships to those illustrated in the drawings and described in the specification are intended to be encompassed by the present invention.

One potential variation of the preferred embodiment is to use the fundamental mode and the fifth overtone frequencies, in Which case the frequency ratio of the frequency source to its lower harmonic eigenmode is five.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

What is claimed is:

1. A method for reducing phase noise and improving quality of a resonator, the method comprising:

operating a resonator such that the resonator oscillates at a fundamental frequency $f_1$ and acoustically generates a harmonic having a frequency $f_2$, wherein operating a resonator comprises applying a first drive voltage to the resonator to cause the resonator to oscillate at frequency $f_1$, applying a second drive voltage to the resonator to cause the resonator to oscillate at frequency $f_2$, and increasing the first drive voltage to the resonator to cause an eigenmode with frequency $f_1$ to vibrate nonlinearly in the resonator; and adjusting a ratio between frequency $f_1$ and frequency $f_2$ to a value of approximately three that is effective to improve the quality of the resonator to the extent that the phase noise of the frequency $f_2$ is reduced.

2. The method according to claim 1, further comprising using the eigenmode with frequency $f_2$ as a frequency source and adjusting the second drive voltage to the resonator to lower levels.

3. The method according to claim 1, wherein adjusting the ratio comprises individually trapping the frequency $f_1$ and the frequency $f_2$ in an electrode having two or more distinct thicknesses, wherein extra mass is added near a center of the resonator.

4. The method according to claim 1, wherein adjusting the ratio comprises individually trapping the frequency $f_1$ and the frequency $f_2$ in a tri-mesa plate having varying thickness.

5. The method according to claim 1, wherein adjusting the ratio comprises changing a curvature of a plate such that variation between the frequency $f_1$ and the frequency $f_2$ changes with the curvature.

6. The method according to claim 1, wherein adjusting the ratio comprises changing electrode dimensions associated with generation of the frequency $f_1$ and the frequency $f_2$.

7. The method according to claim 1, wherein adjusting the ratio comprises varying the temperature of the resonator.

8. The method according to claim 1, further comprising setting the second drive voltage of frequency $f_2$ to a value where frequency $f_2$ is linear.

9. The method according to claim 1, further comprising setting a first drive level of the fundamental frequency to a value that causes frequency $f_1$ to enter a nonlinear Duffing regime.

10. The method according to claim 1, wherein a first eigenmode, at frequency $f_1$, is configured to operate as a nonlinear resonator to reduce phase noise in a second eigenmode, and the second eigenmode, at frequency $f_2$ is configured to operate as a frequency source for an oscillator.

11. The method according to claim 1, wherein the resonator comprises at least one of a bulk acoustic wave resonator, a surface acoustic wave resonator, a solidly mounted resonator, and a film bulk acoustic resonator.

12. The method according to claim 10, wherein the first and second eigenmodes belong to the same family of eigenmodes.

* * * * *